(12) United States Patent
Audebert et al.

(10) Patent No.: US 8,283,949 B2
(45) Date of Patent: Oct. 9, 2012

(54) SYSTEM FOR CONVERTING CHARGE INTO VOLTAGE AND METHOD FOR CONTROLLING THIS SYSTEM

(75) Inventors: Patrick Audebert, Varces Allières et Risset (FR); Jérôme Willemin, Tullins (FR)

(73) Assignee: Commissariat a l'Energie Atomique et Aux Energies Alterntives, Paris (FR)

( * ) Notice: Subject to any disclaimer, the term of this patent is extended or adjusted under 35 U.S.C. 154(b) by 113 days.

(21) Appl. No.: 12/854,364

(22) Filed: Aug. 11, 2010

(65) Prior Publication Data

US 2011/0001519 A1 Jan. 6, 2011

Related U.S. Application Data

(63) Continuation of application No. PCT/FR2009/050459, filed on Mar. 19, 2009.

(30) Foreign Application Priority Data

Mar. 19, 2008 (FR) ...................................... 08 51764

(51) Int. Cl.
*H02M 11/00* (2006.01)
(52) U.S. Cl. ........................................ 327/103; 327/337
(58) Field of Classification Search .................. 327/102, 327/103, 337, 544, 554
See application file for complete search history.

(56) References Cited

U.S. PATENT DOCUMENTS

| | | | | |
|---|---|---|---|---|
| 5,166,630 A | * | 11/1992 | Lee | 327/554 |
| 5,488,415 A | * | 1/1996 | Uno | 348/241 |
| 5,705,807 A | | 1/1998 | Throngnumchai et al. | |
| 7,847,625 B2 | * | 12/2010 | Roh et al. | 327/554 |
| 8,035,439 B2 | * | 10/2011 | Chuang et al. | 327/337 |
| 2006/0158542 A1 | | 7/2006 | Mizuno et al. | |

FOREIGN PATENT DOCUMENTS

EP 1 515 541 A2 3/2005

OTHER PUBLICATIONS

Navid Yazdi, et al., "Precision Readout Circuits for Capacitive Microaccelerometers," Sensors, 2004, Proceedings of IEEE Vienna, Austria, Oct. 24-27, 2004, pp. 28-31.

* cited by examiner

*Primary Examiner* — Hai L Nguyen
(74) *Attorney, Agent, or Firm* — Burr & Brown

(57) ABSTRACT

The invention relates to controlling a device for converting charge into voltage comprising an amplifier and at least one capacitor mounted in inverse feedback between an input and an output of said amplifier, whereby said amplifier can be connected between at least one input stage, to receive a charge therefrom, and at least one output stage to deliver voltage thereto, said voltage being representative of the charge received at the input, said method comprising at least one phase comprising the voltage conversion of a charge received at the input. According to the invention the conversion phase comprises at least: one first sub-phase during which the amplifier is connected to the input stage and the amplifier is disconnected from the output stage; followed, by a second sub-phase during which the amplifier is disconnected from the input stage and the amplifier is connected to the output stage.

8 Claims, 12 Drawing Sheets

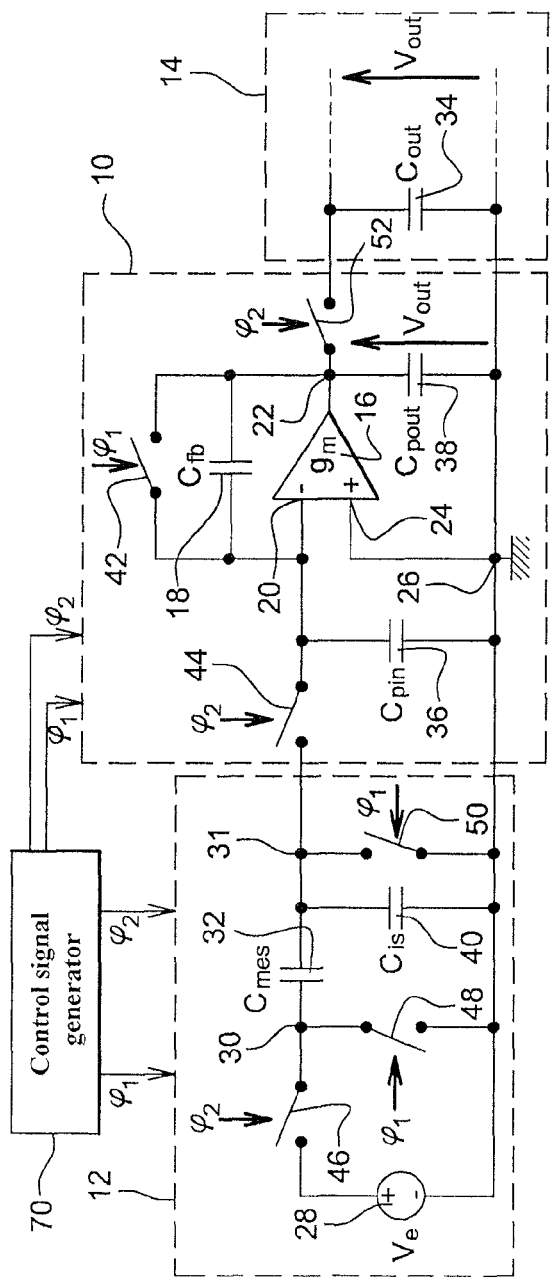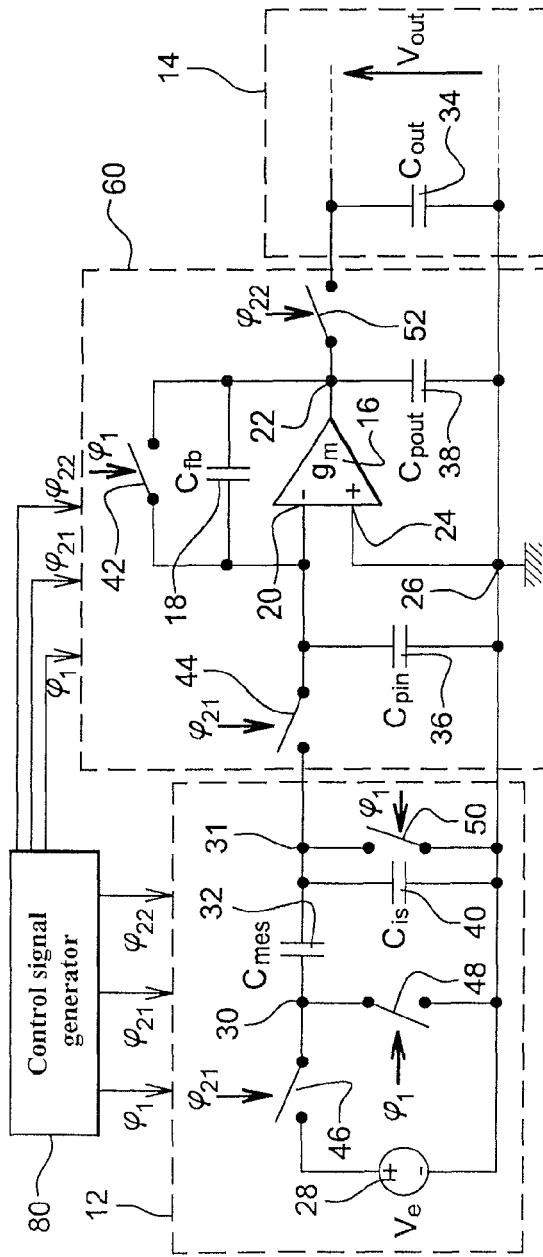

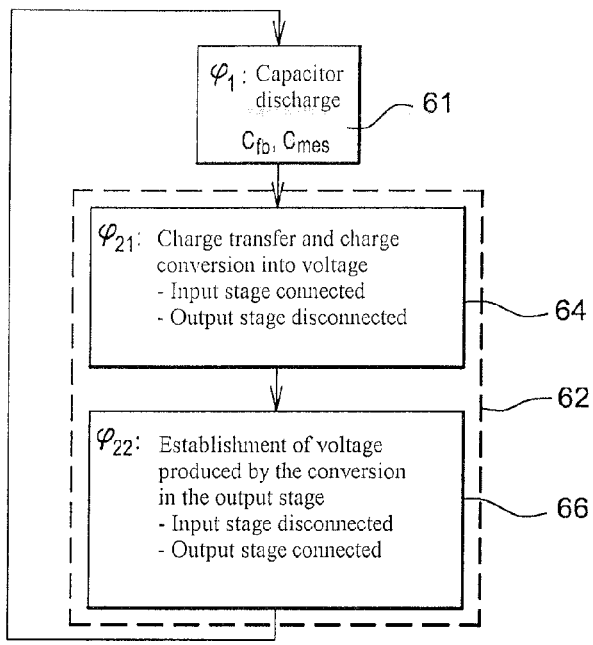
Fig. 3
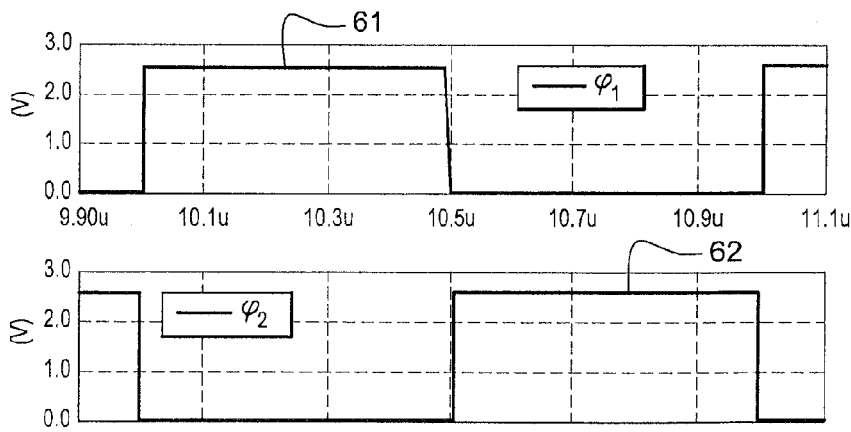
Fig. 4
Fig. 5
Prior Art
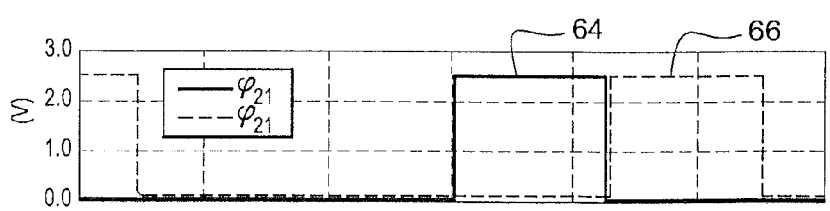
Fig. 6
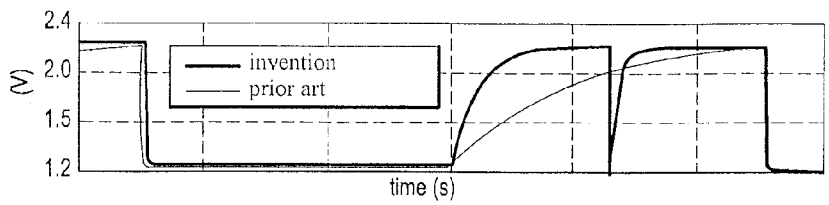
Fig. 7

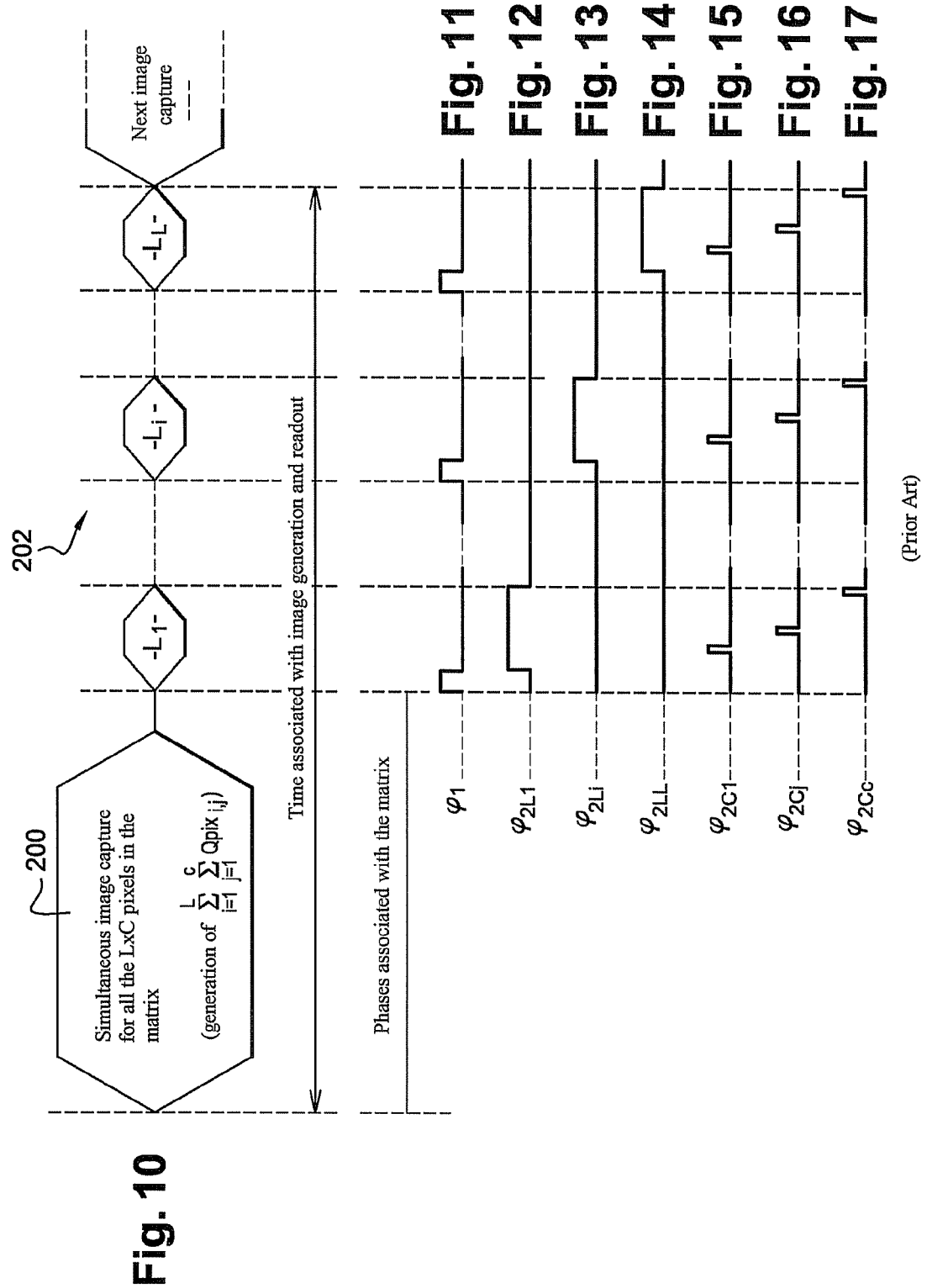

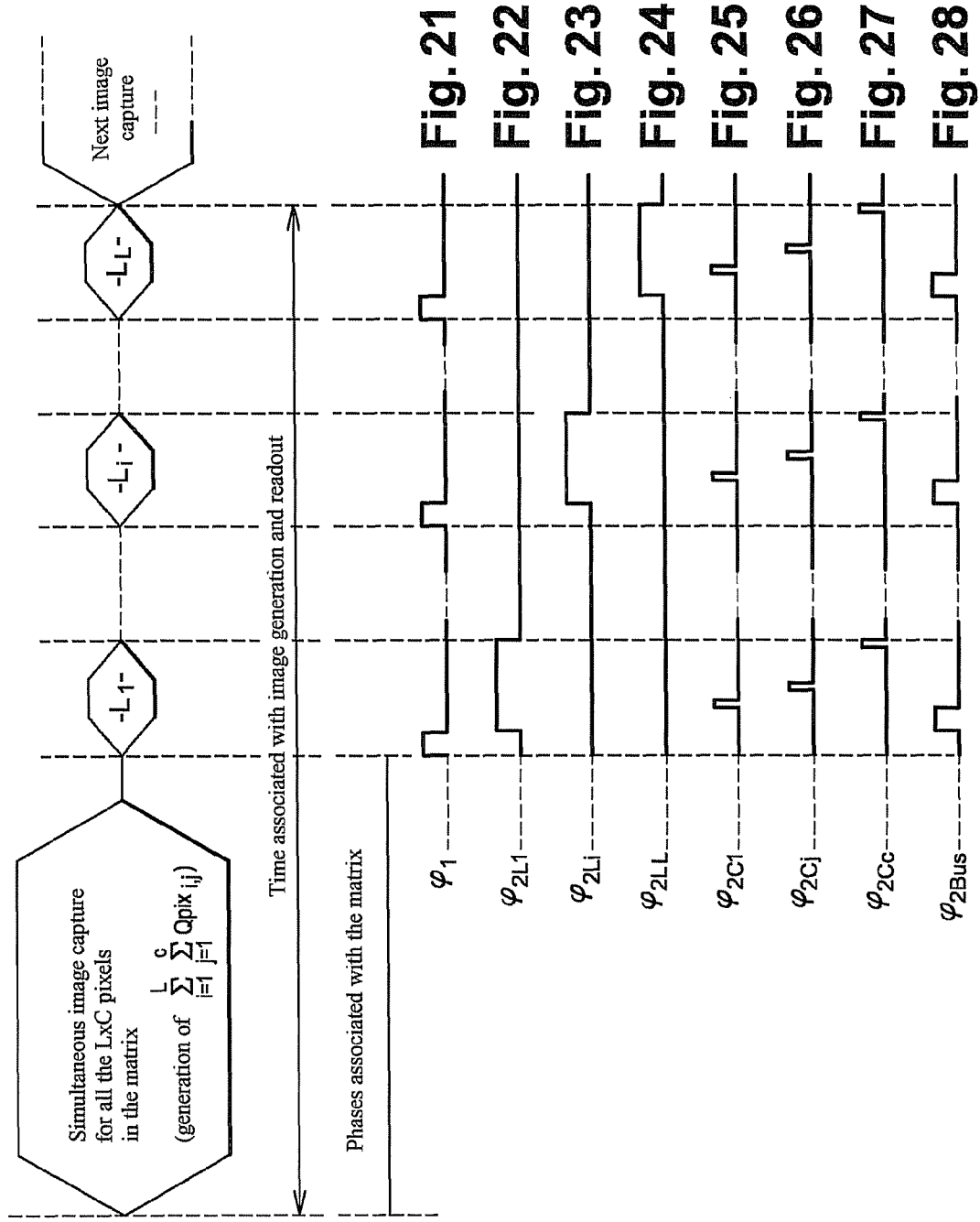

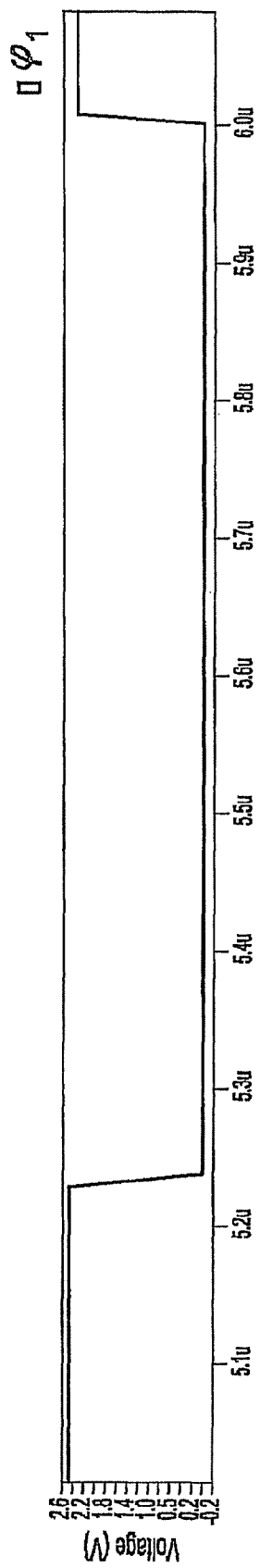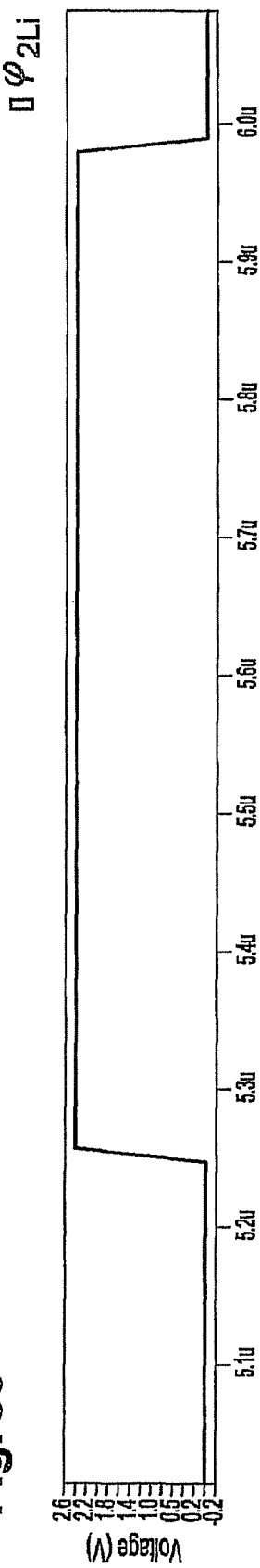
Fig. 29
Fig. 30

SYSTEM FOR CONVERTING CHARGE INTO VOLTAGE AND METHOD FOR CONTROLLING THIS SYSTEM

FIELD OF THE INVENTION

The invention relates to the charge conversion field.

To be more specific, the invention relates to a method for controlling a device for converting charges comprising an amplifier and at least one capacitor mounted in inverse feedback between an input and an output of said amplifier, whereby said amplifier can be connected between at least one input stage, to receive a charge therefrom, and at least one output stage to deliver voltage thereto, said voltage being representative of the input charge, said method including at least one phase comprising the voltage conversion of the charge received at the input.

BACKGROUND OF THE INVENTION

Charge amplification by means of an operational amplifier with inverse feedback via a capacitor is used in many readout applications, such as for example voltage readout, capacitor readout or charge packet readout.

As is known per se, an operational amplifier has a limited voltage gain in the defined range of its supply voltages. The gain is further limited to a range of frequencies, with the amplifier usually having a gain of the low-pass type. Moreover, this frequency range depends on the impedance of the charges connected at the amplifier input and output, charges which therefore have an effect on the time taken to establish the amplified signal at the amplifier output.

To overcome these drawbacks, an impedance is conventionally mounted in inverse feedback between the inverting input and the output of the amplifier, in such a way that the transfer function of the system so looped does not depend predominantly on this impedance.

When the inverse feedback impedance is a capacitor, we then talk about charge amplification. Indeed, an operational amplifier with inverse feedback via a capacitor amplifies the charges it receives at input.

FIG. 1 shows a prior art device for converting charge into voltage 10. This amplification device 10 is connected at input to an input stage 12 and at output to an output stage 14.

The conversion device 10 includes an operational amplifier 16, of transconductance $g_m$, and an inverse feedback capacitor 18, of value $C_{fb}$, connected between the inverting terminal 20 and the output terminal 22 thereof. The non-inverting terminal 24 of the amplifier 16 is for its part connected to a reference potential, such as an earth 26 for example.

The input stage 12 comprises a voltage source 28, connected between the earth 26 and a terminal 30 and of value $V_e$, and a voltage conversion capacitor 32, connected between the terminals 30 and 31, of value $C_{mes}$.

The output stage 14 comprises for its part an input equivalent capacitor 34 of value $C_{out}$ and connected between the output terminal 22 of the amplifier 16 and the earth 26.

In the diagram in FIG. 1, parasitic capacitors 36, 38, 40 are also shown. These capacitors are generated by the structure of the transistors, of MOS technology for example, that constitute the amplifier 16, and by the various interconnections (tracks, wires, metal solders, etc.) which exist in, and between, the different elements that have just been described.

Conventionally, these parasitic capacitors 36, 38, 40 are modelled by:

an input parasitic capacitor 36 of the amplifier 16 of value $C_{pin}$. This parasitic capacitor 36 is connected between the inverting terminal 20 thereof and the earth 26;

an output parasitic capacitor 38 of the amplifier 16 of value $C_{pout}$. This parasitic capacitor 38 is connected between the output terminal thereof and the earth 26;

and a parasitic capacitor 40 of the input stage connections, of value $C_{is}$. This parasitic capacitor 40 is connected in parallel to the input parasitic capacitor 36 of the amplifier.

Controllable circuit breakers 42, 44, 46, 48, 50, 52 are also provided, a first circuit breaker 42 being connected in parallel to the inverse feedback capacitor 18, a second circuit breaker 44 being connected at the input of the amplifier 16 between the inverting terminal 20 and the terminal 31 of the capacitor 32 of the input stage 12, a third circuit breaker 46 being connected between this capacitor 32 and the voltage source 28, a fourth circuit breaker 48 being connected between the terminal 30 of the input stage and the earth 26, a fifth circuit breaker 50 being connected between the terminal 31 of the input stage and the earth 26, and a sixth circuit breaker 52 being connected between the output 22 of the amplifier 16 and the input equivalent capacitor 34 of the output stage 14.

The circuit breakers 42, 44, 46, 48, 50, 52 are controlled by a generator 70 of two control signals $\phi_1$, $\phi_2$ in accordance with a strategy for switching on and off as described hereinafter, the signal $\phi_1$ controlling the switching on and off of the circuit breakers 42, 48 and 50, and the signal $\phi_2$ controlling the switching on and off of the circuit breakers 44, 46 and 52.

Depending on the nature of the circuit breakers, the generator 70 may possibly be led to deliver signals that are complementary in terms of binary logic, particularly in respect of controlling CMOS circuit breakers.

FIG. 1 for example shows amplification of the voltage $V_e$ by means of charge amplification.

Initially, the first, fourth and fifth circuit breakers 42, 48 and 50 are off and the second, third and sixth circuit breakers 44, 46, 52 are on. The inverse feedback capacitors 18 and voltage conversion capacitors 32 are therefore discharged.

Secondly, the first, fourth and fifth circuit breakers 42, 48 and 50 are on and the second, third and sixth circuit breakers 44, 46, 52 are off. The voltage $V_e$ at the terminals of the source 28 is thus converted into a charge $Q_e$ by the voltage conversion capacitor 32, and an equivalent charge $Q_e'$ (= $Q_e$) is generated at the terminals of the inverse feedback capacitor 18 by conserving the charge at the non-inverting input 20 of the amplifier 16. This charge $Q_e'$ is converted into voltage $V_{out}$ by means of the inverse feedback capacitor 18. This voltage $V_{out}$ can be observed at the terminals of the capacitors $C_{pout}$ 38 and $Q_{out}$ 34.

The transfer function between amplified voltage $V_{out}$ and the voltage $V_e$ is thus given by the following formula:

$$G(s) = \frac{C_{mes}R_{out}(-g_m + C_{fb}s)}{(C_{mes} + C_{is} + C_{pin})(1 + (C_{out} + C_{pout})R_{out}s) + C_{fb}(1 + R_{out}(C_{mes} + C_{out} + C_{pout} + C_{pin} + C_{is})s)} \quad (1)$$

where s is the Laplace variable and $R_{out}$ the output impedance of the operational amplifier 16.

The transfer function G(s) is therefore of the first order low-pass type.

The continuous gain $G_0$ of the function $G(S)$ is given by the formula:

$$G_0 = -\frac{C_{mes} g_m R_{out}}{C_{mes} + C_{pin} + C_{is} + C_{fb}(1 + g_m R_{out})} \quad (2)$$

The cutoff frequency $\omega_c$ is furthermore equal to:

$$\omega_c = \frac{g_m}{C_{eq}} \quad (3)$$

where $C_{eq}$ is a capacitor according to the formula:

$$C_{eq} = \frac{(C_{pout} + C_{out})(C_{mes} + C_{pin} + C_{is}) + C_{fb}(C_{pout} + C_{out} + C_{mes} + C_{pin} + C_{is})}{C_{fb}} \quad (4)$$

It will be noted that the capacitor $C_{eq}$ may be rewritten according to the formula:

$$C_{eq} = \frac{C_S C_E + C_{fb}(C_S + C_E)}{C_{fb}} \quad (5)$$

where $C_E = C_{mes} + C_{pin} + C_{is}$ is the capacitor seen at input by the amplifier 16 and $C_S = C_{pout} + C_{out}$ is the capacitor seen at output by the amplifier 16.

It can thus be seen from a consideration of the formulae (2) and (3) that to increase the amplification passband and therefore the speed thereof (the higher the cutoff pulsatance $\omega_c$ the shorter the amplifier output signal establishment time), $\omega_c$ needs to be maximized.

To do this, it is possible to minimize the equivalent capacitance $C_{eq}$ or to maximize the transconductance $g_m$ of the amplifier 16.

However, increasing the transconductance $g_m$ involves using a high-energy consuming amplifier. Additionally, increasing the transconductance $g_m$ also results, in respect of the amplifier, in a transistor geometry with larger parasitic capacitors $C_{pin}$ and $C_{pout}$. The equivalent capacitance $C_{eq}$ is then larger and the cutoff pulsatance $\omega_c$ smaller.

The passband may also be increased by minimizing the equivalent capacitance $C_{eq}$.

To lower the value thereof, it is possible to maximize the value of the inverse feedback capacitor $C_{fb}$. In fact, maximizing $C_{fb}$ has the effect of reducing the continuous gain $G_0$, which runs counter to the primary intended aim, namely amplification.

That is why, passband maximization is usually sought and obtained by minimizing the parasitic capacitors $C_{pin}$ and $C_{pout}$. Research has thus been carried out on the structure and geometry of the transistors constituting the amplifier 16. Said research is however long and complex in so far as it relates to transistor design.

Furthermore, even though the parasitic capacitors might be optimized, the equivalent capacitance $C_{eq}$ still depends on the input 12 and output 14 stages, and particularly on the capacitors $C_{mes}$, $C_{is}$ and $C_{out}$. The passband gain, and therefore the establishment time gain, is limited by the presence of these capacitors. Likewise, there are still parasitic capacitors at the amplifier input and output which are not connected to the amplifier itself. The parasitic capacitors of the connections of the amplifier 16 with the input 12 and output 14 stages may be cited in particular.

It will be noted that the problems disclosed above are posed in the same way in other charge amplification applications. For example, it will also be noted that FIG. 1 shows the readout of the value $C_{mes}$ of the capacitor 32 whereof the value is unknown.

In such an application the value of the voltage $V_e$ is known and the voltage $V_{out}$ at the terminals of the charge conversion capacitor 34 measured. The transfer function between the voltage $V_{out}$ and the capacitor $C_{mes}$ is then given by the formula:

$$G_0 = \frac{V_e g_m R_{out}}{C_{mes} + C_{pin} + C_{is} + C_{fb}(1 + g_m R_{out})} \quad (2C)$$

This transfer function is also of the lowpass type with cutoff pulsatance similar to that in the formula (3). Said application is for example described in the document by N. Yazdi et al. "*Precision readout circuits for capacitive microaccelerometers*", Sensors 2004, Proceedings of IEEE.

It will be noted that said application generally comprises measuring the variations in the voltage conversion capacitor 32 ($C_{mes}$) around a reference value that is much higher than said variations. This involves in particular choosing the inverse feedback capacitor 18 to be of the same order of magnitude as the variations in the capacitor 32, so that the equivalent capacitance is substantially equal to $$C_{eq} = \frac{C_S C_E}{C_{fb}}.$$

The influence of the parasitic capacitors on the amplification passband is therefore strengthened as a result.

These problems are also posed in the case of voltage conversion of charge packets from a plurality of input stages sharing a single conversion device. The input stages are for example the pixels of a column of a matrix sensor such as a CCD or CMOS image sensor, which periodically delivers charge packets for conversion into voltage on a column bus.

In a similar way to the aforementioned applications, the transfer function between the voltage $V_{out}$ and a received charge packet $Q_e$ is of the low-pass type according to the formula:

$$G_0 = \frac{g_m R_{out}}{C_{mes} + C_{pin} + C_{is} + C_{fb}(1 + g_m R_{out})} \quad (2Q)$$

The cutoff pulsatance of this transfer function is therefore similar to that of the formula (3). It will be noted that in this application, the parasitic capacitor connected to the column bus connection is very large, thereby limiting the voltage conversion passband of the incident charge packets.

The aim of the invention is to resolve the abovementioned problem by proposing a method for controlling the conversion device which allows a significant gain in passband, and therefore in establishment time, and does so by modifying at least the structure, the operation or the arrangement of the amplifier or of the input and output stages, and without getting a reduction in the final conversion gain.

SUMMARY OF THE INVENTION

To this end, the purpose of the invention is a method for controlling a charge conversion device comprising an amplifier and at least one capacitor mounted in inverse feedback between an input and an output of said amplifier, whereby said amplifier can be connected between at least one input stage, to receive a charge therefrom, and at least one output stage to deliver voltage thereto, said voltage being representative of the incident charge received, said method comprising at least one phase comprising the voltage conversion of the charge received at the input.

According to the invention, the conversion phase comprises at least:

a first sub-phase during which the amplifier is connected to the input stage and the amplifier is disconnected from the output stage;

followed, by a second sub-phase during which the amplifier is disconnected from the input stage and the amplifier is connected to the output stage.

In other words, the amplifier is isolated in turn from the input stage and the output stage capacitors. At each of the sub-phases, the equivalent capacitance so obtained is less than the equivalent capacitance $C_{eq}$. The accumulated establishment time of these two sub-phases is thus less than that commonly observed when implementing the prior art amplification phase.

According to particular embodiments of the invention, the method comprises one or more of the following characteristics:

the durations of two sub-phases are substantially identical;

the durations of two sub-phases are regulated as a function of the time constants of the units formed, on the one hand, by the amplification device connected to the input stage, and on the other hand, by the amplification device connected to the output stage;

the or each amplifier is an operational amplifier whereof the inverting input and the output are mounted in inverse feedback via a capacitor;

the or each amplifier is a differential operational amplifier, whereof each input is mounted in inverse feedback with an output of the amplifier by means of a capacitor;

A further purpose of the invention is a charge amplification system. This includes:

an amplification device including an amplifier and at least one capacitor mounted in inverse feedback between an input and an output of said amplifier, whereby said amplifier can be connected between at least one input stage, to receive a charge therefrom, and at least one output stage to deliver voltage thereto, said voltage being representative of the charge received at the input;

a first controllable element capable of discharging the inverse feedback capacitor, a second controllable element capable of disconnecting the amplifier from the input stage;

a controllable device capable of controlling the first and second controllable elements according to a phase of discharging the inverse feedback capacitor, and a phase of amplifying a charge received from the input stage by the amplifier.

According to the invention:

the location of the connection and disconnection of the amplifier to and from the input stage and/or the location of the connection and disconnection of the amplifier to and from the output stage is placed as close as possible to the amplifier;

the system further comprises a third controllable element capable of disconnecting the amplifier from the output stage, the control device being capable, at the amplification phase, at least of:

controlling the second controllable element in order to connect the amplifier to the input stage and controlling the third controllable element in order to disconnect the amplifier from the output stage;

then, controlling the second controllable element in order to disconnect the amplifier from the input stage and controlling the third controllable element in order to connect the amplifier to the output stage.

In other words, this system implements the aforementioned method.

According to one embodiment, the input stage is of the Micro-Electro-Mechanical Systems (MEMS) or Nano Electro-Mechanical Systems (NEMS) type and comprises a time-variable capacitor, the input stage producing a charge as a function of said variable capacitor.

In other words, the invention can be used to advantage to measure variations in the capacitance of a capacitor incorporated into a MEMS or NEMS device, such as for example an accelerometer or a gyrometer with the capacitance of the capacitor thereof varying as a function of the accelerations sustained.

According to one particular embodiment of the invention, the input stage includes a column of a matrix of detection elements, whereby the charge conversion device can be connected to each of the detection elements of said column to receive a charge therefrom.

In other words, prior art imaging matrix readout circuits commonly include charge conversion devices at the end of each column of the matrix in order to convert sequentially the electrical charges produced by the unitary detection elements, or pixels, of the column. In fact, prior art charge conversion devices remain constantly connected to the column buses through which the charges from the pixels pass. Said column buses commonly have very high parasitic capacitance and the larger the matrix dimensions the bigger this is. This results in a very significant readout time for the charges produced on account of a high equivalent capacitance. The effect of disconnecting the charge devices from these column buses when establishing the voltages at output from the conversion device is thus a significant increase in establishment speed.

By retaining the duration of a prior art readout frame, a conversion and total transfer of the charge to the output stage can then be seen.

According to one embodiment of the invention, the first controllable element and/or the second controllable element is placed as close as possible to the amplifier.

In other words, the maximum number of elements are connected to and disconnected from the amplifier, and particularly the connections connecting the amplifier to the input stage and to the output stage. Indeed it is known that these connections commonly have a large parasitic capacitance. By ensuring connection and disconnection as close as possible to the physical elements actually responsible for the amplification, the equivalent capacitance is then optimized.

BRIEF DESCRIPTION OF THE DRAWINGS

The invention will be better understood by reading the following description, given solely by way of example, and drawn up in relation to the appended drawings wherein identical reference numbers denote identical or similar elements, and wherein:

FIG. 1 is a diagrammatic view of a device for switched-capacitor charge conversion as in the prior art and as already described in the pre-characterizing portion;

FIG. 2 is a diagrammatic view of a device for switched-capacitor charge conversion according to a first embodiment of the invention;

FIG. 3 is a flowchart of a method according to the invention;

FIGS. 4 to 7 are curve graphs showing the various charge amplification phases according to the invention and the prior art in FIG. 1.

FIGS. 10 to 17 are timing diagrams for circuit breaker control signals forming part of the charge converter in FIG. 8;

FIGS. 20 to 28 are timing diagrams for circuit breaker control signals forming part of the charge converter of the invention in FIG. 18;

FIGS. 29 to 34 are curve graphs showing the various charge amplification phases using a charge converter of the invention and a prior art charge converter.

DETAILED DESCRIPTION OF THE INVENTION

Figure 8:
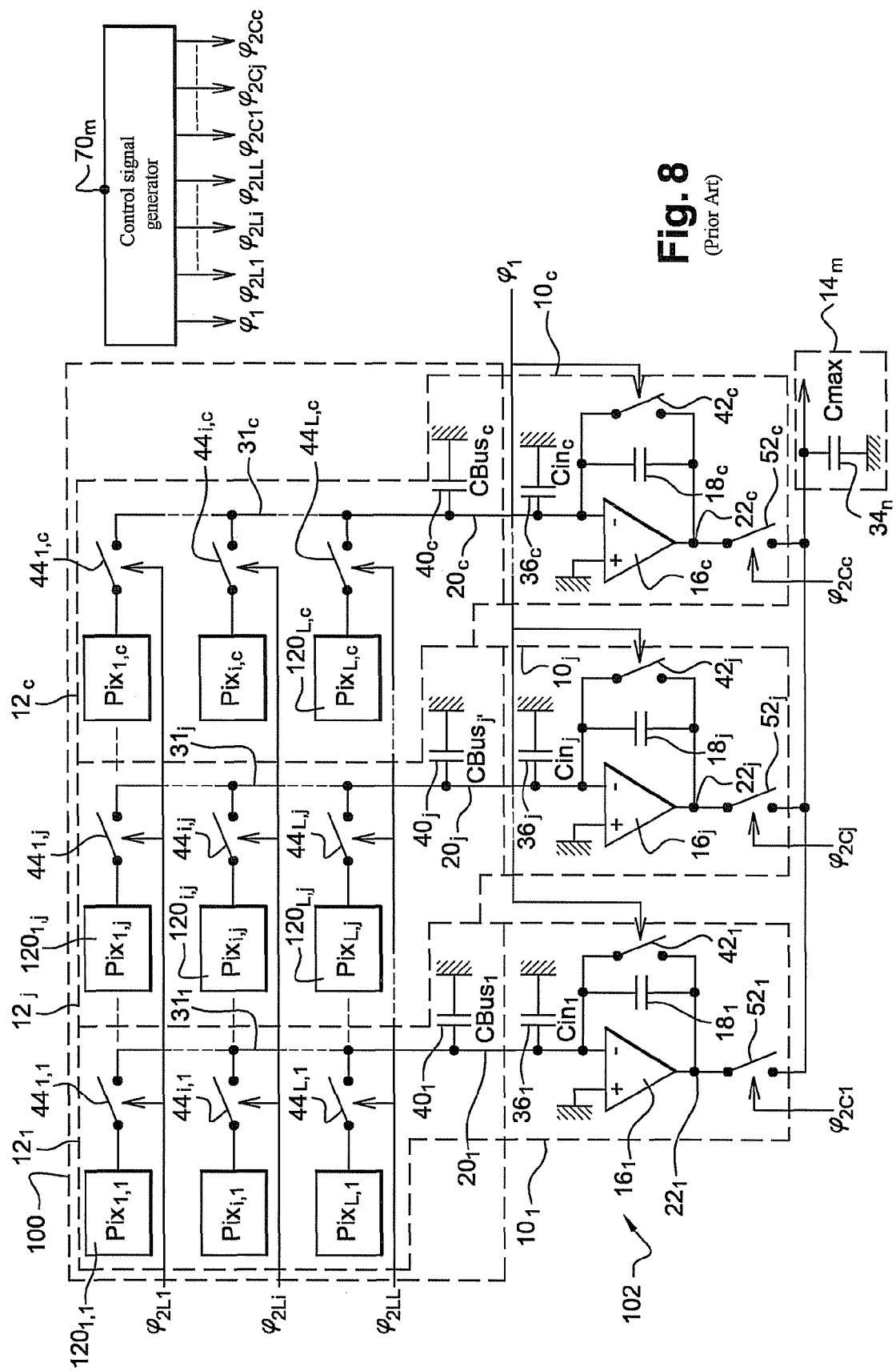
FIG. 8 is a diagrammatic view of a prior art charge converter associated with a matrix of pixels arranged in L lines and C columns.
Figure 9:
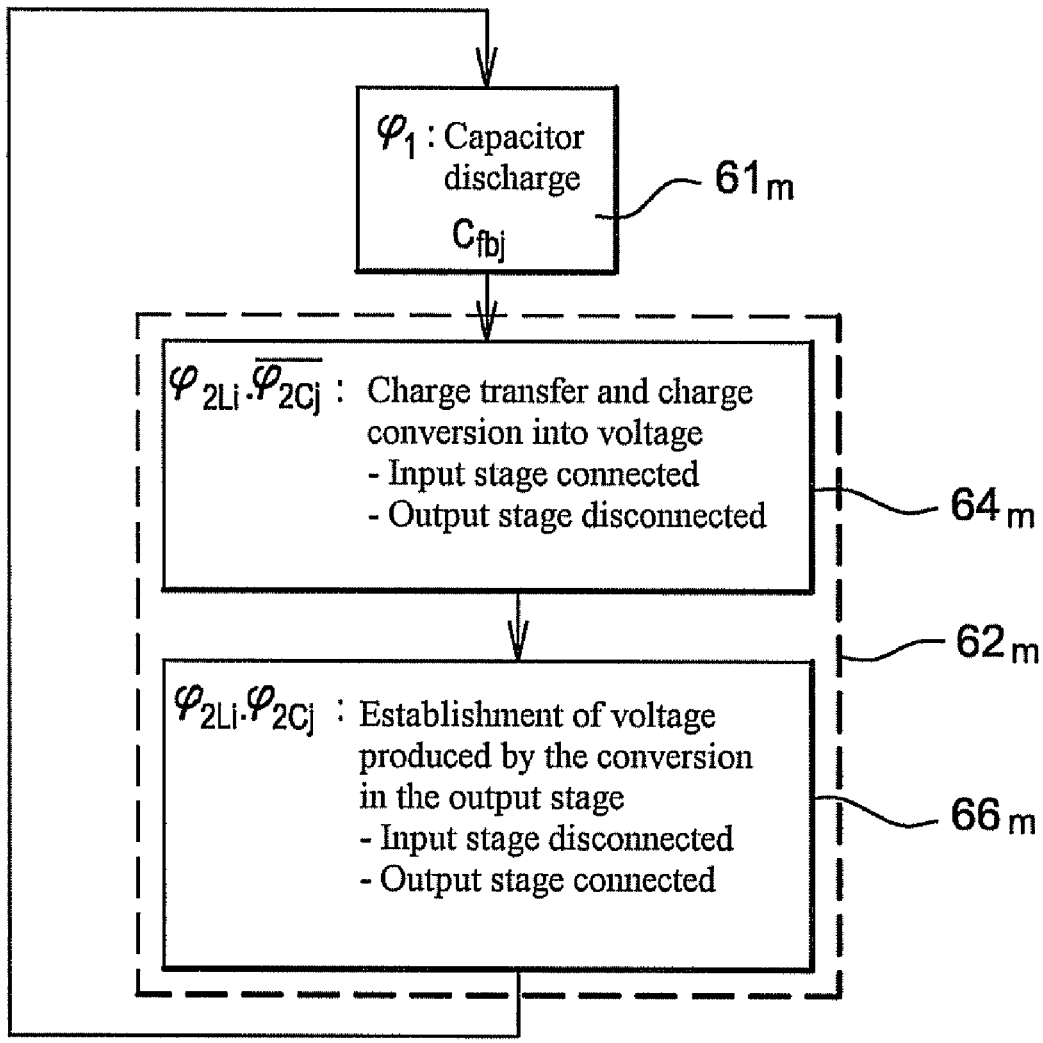
FIG. 9 is a flowchart of a method for controlling a charge conversion device forming part of the charge converter in FIG. 8.

In FIG. 2, a charge conversion device 60 according to the invention is connected at input to the input stage 12 and at output to the output stage 14. The arrangement in FIG. 2 shows for example the amplification of the voltage $V_e$ or the measurement of variations in the voltage conversion capacitor 32, as has been explained in further detail above.

In one advantageous application of the invention, the input stage 12 is a micro-electro-mechanical (or MEMS) device or a nano electro-mechanical (or NEMS) device. For example, the input stage 12 is formed of an accelerometer or a gyrometer whereof the capacitor 32, formed of interdigited combs whereof at least one is mobile, varies in time. The charge conversion device 60 is to advantage made using the same MEMS or NEMS technology as the input stage 12.

The charge conversion device 60 differs from the prior art device 10, described hereinafter in relation to FIG. 1, in that it is associated with a generator 80 of at least three different control signals $\phi_1$, $\phi_{21}$, $\phi_{22}$ of the circuit breakers 42, 44, 46, 48, 50 and 52, the signal $\phi_1$ controlling the switching on and off of the circuit breakers 42, 48 and 50, the signal $\phi_{21}$ controlling the switching on and off of the circuit breakers 44 and 46, and the signal $\phi_{22}$ controlling the switching on and off of the circuit breaker 52.

Depending on the nature of the circuit breakers the generator 80 will possibly be led to deliver signals that are complementary in terms of binary logic, particularly in respect of CMOS circuit breaker control.

The method for controlling the circuit breakers 42, 44, 46, 48, 50 and 52 implemented by the generator 80 is shown in the flowchart in FIG. 3.

During a first step 61, similar to that in the prior art, the first, third and fifth circuit breakers 42, 48, 50 are off and the second, fourth and sixth circuit breakers 44, 46, 52 are on. All the capacitors 18, 32, 36, 38, 40 are thus discharged.

The discharge phase of step 61 is then followed, at 62, by a charge conversion phase.

In a first sub-phase 64 of the conversion phase 62, the first, third and fifth circuit breakers 42, 48, 50 are on, and the second and fourth circuit breakers 44, 46 are off. The fifth circuit breaker 52 is left on, the output terminal 22 of the amplifier 16 being thereby disconnected from the output stage 14.

Thus, the voltage $V_e$ is converted into a charge $Q_e$ by the voltage conversion capacitor 32, and the charge $Q_e$ is converted by the amplifier with inverse feedback 16, 18. The converted charge is stored in the inverse feedback capacitor 18, thus generating the voltage $V_{out}$ at the output terminal 22.

In a second sub-phase 66, the second and fourth circuit breakers 44, 46 are on, thereby disconnecting the non-inverting input 20 of the amplifier 16 from the input stage 12. The fifth circuit breaker 52 for its part is off, thereby connecting the output of the amplifier 16 to the output stage 14.

The voltage $V_{out}$ generated at the terminals of the inverse feedback capacitor 18 is thus transferred to the output stage 14, in other words stored in this instance in the capacitor $C_{out}$ 34 thereof.

The conversion step 62 then re-loops to the step 61 for a new cycle of amplification of the voltage $V_e$ or of readout, in the form of voltage, of the capacitor $C_{mes}$ 32.

The three steps 61, 64 and 66 implemented by the generator 80 never have an instant in common. These three steps are always intersected by a small time fraction during which all the circuit breakers are on so that the various charge transfers can be rigorously managed, in other words without loss.

FIGS. 4 to 7 show readout cycles of the voltage conversion capacitor 32, according to the prior art and according to the invention. The capacitor 32 is for example that of the MEMS sensor as described in the aforementioned document by Yadzi.

The conventional characteristics of such a MEMS are 1 picofarad for the value $C_{mes}$ of the capacitor 32, 5 picofarads for the value $C_{is}$ of the parasitic capacitor 40, and the variations $\Delta C_{mes}$ of the value $C_{mes}$ that are required to be measured are of the order of 100 femtofarads.

The characteristics of the conversion device, described for example in the document by Yadzi, are 100 femtofarads for the value $C_{pin}$ of the parasitic capacitor 36, 100 femtofarads for the value $C_{fb}$ of the inverse feedback capacitor 18, 300 µA/V for the value $g_m$ of the transconductance of the amplifier 16 and 1 picofarad for the value $C_{out}$ of the capacitor 34 and 100 femtofarads for the value $C_{pout}$ of the capacitor 38.

With these values, the equivalent capacitance $C_{eq}$ is then equal to 73.6 picofarads, which defines an establishment of 87% of the voltage $V_{out}$ when the prior art phases $\phi_1$ and $\phi_2$ are each equal to 500 ns, i.e. a sampling frequency of 1 MHz for the readout of the variations $\Delta C_{mes}$ The sub-phases 64 and 66 according to the invention are for their part chosen in this instance to be of equal duration, in other words a duration of 250 nanoseconds each.

FIG. 4 shows in respect of both the prior art and the invention, the signal $\phi_1$ for controlling the circuit breakers 42, 48 and 50. The control signal value of 2.5 volts equates in this instance in an order of switching off the corresponding circuit breakers.

FIG. 5 shows, for the prior art arrangement in FIG. 1, the control signal $\phi_2$ for the circuit breakers 44, 46 and 52.

FIG. 6 shows, for the arrangement of the invention in FIG. 2, the control signal $\phi_{21}$ for the circuit breakers 44 and 46 and the control signal $\phi_{22}$ for the circuit breaker 52.

FIG. 7 shows the voltage at the output terminal 22 of the amplifier according to the prior art (thin line curve) and according to the invention (bold continuous line). As may be noted in FIG. 7, in the prior art, the time for establishing the voltage $V_{out}$ is too long for the read charge Qe in its entirety to be converted and simultaneously available on the capacitor 34 of the output stage 14. At the end of the conversion phase, (switching the signal $\phi_2$ from the 2.5 volt value to the 0 volt value), only 87% of the charge has been transferred to the capacitor 34 of the output stage 14.

As can be seen, according to the invention, the charge in its entirety has been transferred at the end of the amplification phase 62.

Indeed, at the first sub-phase 64, the amplifier 16 is disconnected from the output stage 14, and therefore from its capacitor 34. During this first sub-phase 64, the equivalent capacitance $C_{eq}$ is substantially equal to 12 picofarads, which gives a time constant of about 40 nanoseconds. The converted charge in its entirety is therefore properly stored in the capacitor 18, given that the first sub-phase 64 lasts for 250 nanoseconds, this being sufficient time to obtain complete storage.

At the second sub-phase 66, the amplifier 16 is disconnected from the input stage 12 and therefore from its capacitors 32 and 40. During this second sub-phase 66, the equivalent capacitance $C_{eq}$ is substantially equal to 2.3 picofarads, which gives a time constant of about 7.7 nanoseconds, the voltage $V_{out}$ (representative of the quantity of charges converted at the terminals of the inverse feedback capacitor 18) is thus applied at the terminals of the capacitor 34 of the output stage 14, given the 250 nanosecond duration of the sub-phase 66.

As may be noted, the accumulated establishment time according to the invention is about 46.5 nanoseconds. In comparison with the 250 nanosecond establishment time of the prior art, a gain above 5 is obtained in the charge conversion speed.

This allows in particular the value $g_m$ of the transconductance of the amplifier 16 to be lowered significantly, thereby allowing a substantial saving of energy. This also allows amplification cycles to be designed, for example readout cycles of the capacitor 32 with a higher frequency.

It will also be noted that this speed gain is achieved without modifying the structure of the conversion device which remains identical to that of the prior art.

The durations of the two phases 64 and 66 making up the conversion phase 62 are chosen to be equal so as to have a straightforward control of the circuit breakers. Given the speed gain obtained, the device of the invention may thus be incorporated into existing structures with no additional research.

As an alternative, the durations of the two phases 64 and 66 are chosen as a function of the values of the equivalent capacitance $C_{eq}$ at the time thereof. For example the durations are chosen in proportion to these values.

It will be noted that the effect of choosing and sequencing the control signals applied to the circuit breakers 44, 46, 48 and 50 is that the input stage 12 is non-inverting. Since the operational amplifier 16 with inverse feedback via the capacitor 18 is an inverting structure, the association of the input stage 12 and the conversion device 60 is then a structure for the amplification of the voltage $V_e$ or the readout of the capacitor $C_{mes}$ which is inverting, as shown by the "–" sign in the formula (2).

As an alternative, the signals controlling the circuit breakers 46 and 48 previously described are swapped, the circuit breaker 46 then being controlled by the control signal $\phi_1$ and the circuit breaker 48 by the control circuit breaker $\phi_{21}$. The input stage 12 is then inverting.

Since the operational amplifier 16 with inverse feedback via the capacitor 18 is an inverting structure, the continuous gain is then given by formula (2) without the "–" sign. The association of the input stage 12 and the conversion device 60 is thus a structure for amplification of the voltage $V_e$ or readout of the capacitor $C_{mes}$ which is non-inverting.

As an alternative, the circuit breaker 46 (or the circuit breaker 48 in the "inverting" version of the stage 12 described above) found in the input stage 12 is controlled by a control signal similar to the signal $\phi_2$ described in conjunction with the prior art device in FIG. 1, instead of being controlled by the control signal $\phi_{21}$ which controls the connection/disconnection of the conversion device 60 of the input stage 12.

As an alternative, in one or other of the aforementioned input stages (inverting or non-inverting), the circuit breaker 42 of the charge conversion device 60 is omitted in order to add into this same device 60 the various conversions of the input stimuli ($V_e$ or $C_{mes}$) sampled in the input stage 12. The integration function is thus obtained in addition to the amplification function.

To advantage, the circuit breaker 44 is placed as close as possible to the node to which the capacitor 18 and the inverting terminal 20 of the operational amplifier 16 are connected. Switching on the circuit breaker 44 thus disconnects the maximum number of connections of those elements actually responsible for the charge amplification.

For the same reasons, the circuit breaker 52 is placed as close as possible to the node to which the capacitor 18 and the output terminal of the operational amplifier 16 are connected.

The equivalent capacitances in each connection/disconnection phase according to the invention are thus optimized.

An application of the invention has been described in which there is only one single input stage and one single conversion device.

The invention also applies to charge conversion in a matrix 100 of image pixels $120_{11}$-$120_{LC}$ arranged in L lines by C columns. For each column of the matrix 100, the L pixels $120_{1j}$-$120_{Lj}$ are connected via L circuit breakers $44_{1j}$-$44_{Lj}$ to a column bus $31_j$ which has a parasitic capacitor $40_j$ relative to the earth. Each of these C units $120_{11}$-$120_{LC}$, $44_{1j}$-$44_{Lj}$, $31_j$ and $40_j$ constitutes an input stage $12_j$. The matrix 100 therefore breaks down into C input stages $12_1$-$12_C$.

A prior art charge converter 102 is shown in FIG. 8.

The prior art charge converter 102 comprises C charge conversion devices $10_1$-$10_C$. Each of these conversion devices $10_1$-$10_C$ is connected to one of the input stages $12_1$-$12_C$ constituting the matrix of pixels 100 and is capable of being connected to a single output stage $14_m$ constituted by a column multiplexer of capacitance $C_{mux}$.

The conversion device $10_1$-$10_C$ includes an amplifier $16_1$-$16_C$ with inverse feedback via a capacitor $18_1$-$18_C$ of value $C_{fbj}$ and connected between the inverting terminal $20_1$-$20_C$ and the output $22_1$-$22_C$ of the amplifier, a first controllable circuit breaker $42_1$-$42_C$ connected in parallel with the capacitor $18_1$-$18_C$, L second controllable circuit breakers, $44_{1,1}$-$44_{L,C}$ capable of connecting the inverting terminal $20_1$-$20_C$ of the amplifier $16_1$-$16_C$ to each of the pixels of the column, and a third controllable circuit breaker $52_1$-$52_C$ connected to the output $22_1$-$22_C$ of the amplifier.

Lastly, a generator $70_m$ of control signals is also provided to control the first, second and third circuit breakers $42_1$-$42_C$, $44_{1,1}$-$44_{L,C}$, $52_1$-$52_C$. To be more specific, the generator $70_m$ controls the first circuit breakers $42_1$-$42_C$ by means of a signal $\phi_1$, the C second circuit breakers $44_{1,1}$-$44_{L,C}$ in a single line of the matrix 100 by means of a signal $\phi_{2L1}$-$\phi_{2LL}$ respectively, and each of the third circuit breakers $52_1$-$52_C$ by means of a signal $\phi_{2C1}$-$\phi_{2CC}$ respectively.

The operation of the prior art charge converter 102 is shown in FIGS. 9 to 17.

As can be seen in FIG. 11, a so-called "readout" frame of the matrix 100 comprises a first phase 200 of exposure thereof to radiation, during which charges are generated in the pixels $120_{11}$-$120_{LC}$, followed by a phase 202 for the readout of said charges. During the readout phase 202, the matrix 100 is read pixel line by pixel line and thus includes L successive phases for the readout of lines $L_1$-$L_L$.

As can be seen in FIGS. 11 to 17, during a phase comprising the initialization of the readout of a line of pixels of the matrix 100, the C first circuit breakers $42_1$-$42_C$ are off in order to discharge the capacitors $18_1$-$18_C$ and the second and third circuit breakers $44_{L,1}$-$44_{L,C}$, $52_1$-$52_C$ are on.

During a second phase comprising the readout of the line of pixels, the C first circuit breakers $42_1$-$42_C$ are on, the second circuit breakers $44_{L,1}$-$44_{L,C}$ associated with the pixels of this line are off and the third circuit breakers $52_1$-$52_C$ at output from the charge conversion devices $10_1$-$10_C$ are off momentarily in turn so that charge can be transferred to the column multiplexer $14_m$.

It will thus be noted that a charge conversion device $10_1$-$10_C$ implements the sequential conversion of the charges produced by L pixels of a column of the matrix 100.

However, during the charge conversion, the charge conversion device $10_1$-$10_C$ is constantly connected to the column bus $31_1$-$31_C$ and therefore to its parasitic capacitor $C_{bus1}$-$C_{busC}$. In fact, the parasitic capacitance of a column bus is commonly very high, which translates into very significant equivalent capacitance $C_{eq}$. This permanent connection to the column bus $31_1$-$31_C$ thereby very much limits the charge-to-voltage conversion establishment time.

Figure 18:
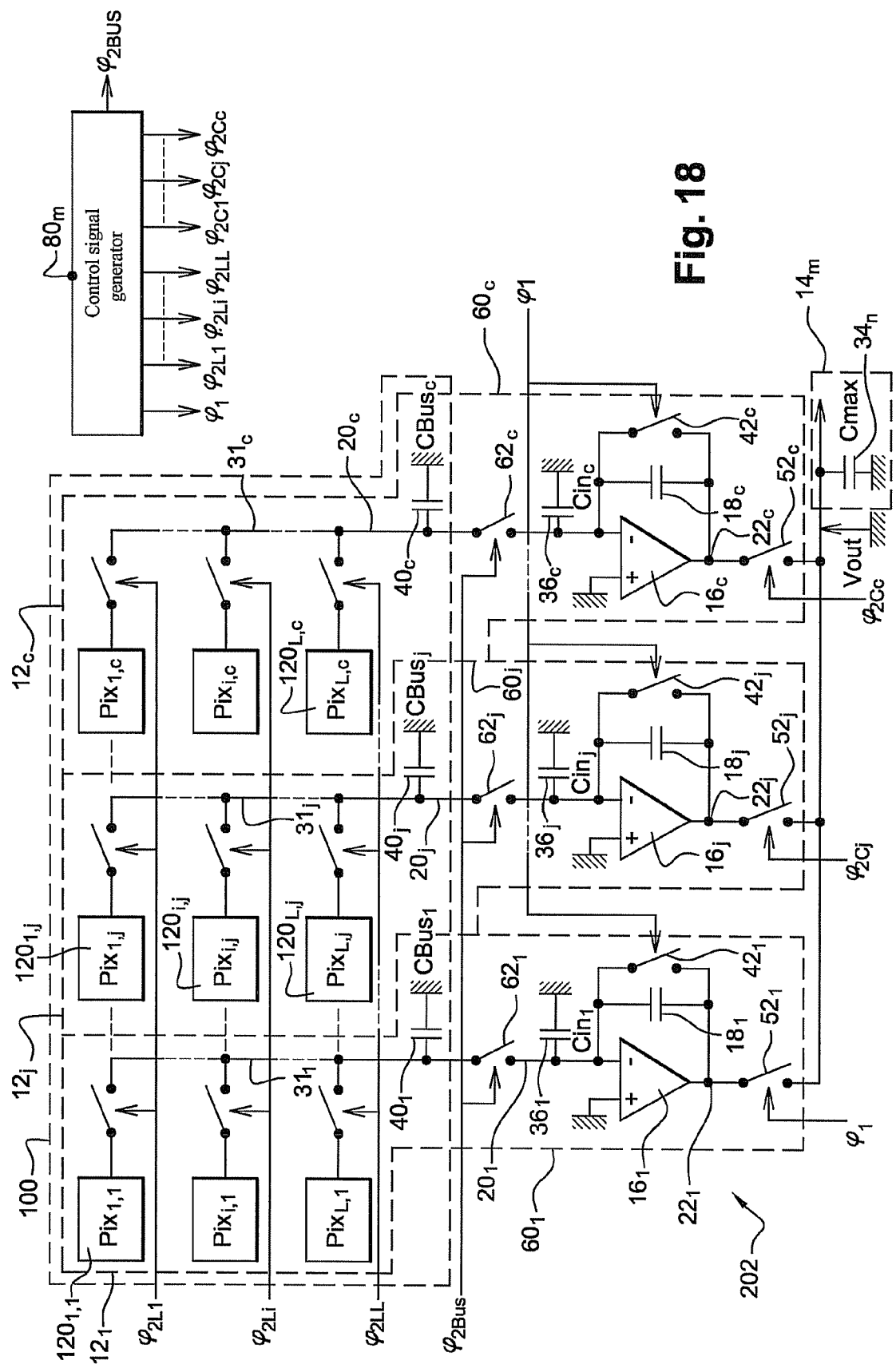
FIG. 18 is a diagrammatic view of a charge converter according to the invention associated with a matrix of pixels arranged in L lines and C columns.
Figure 19:
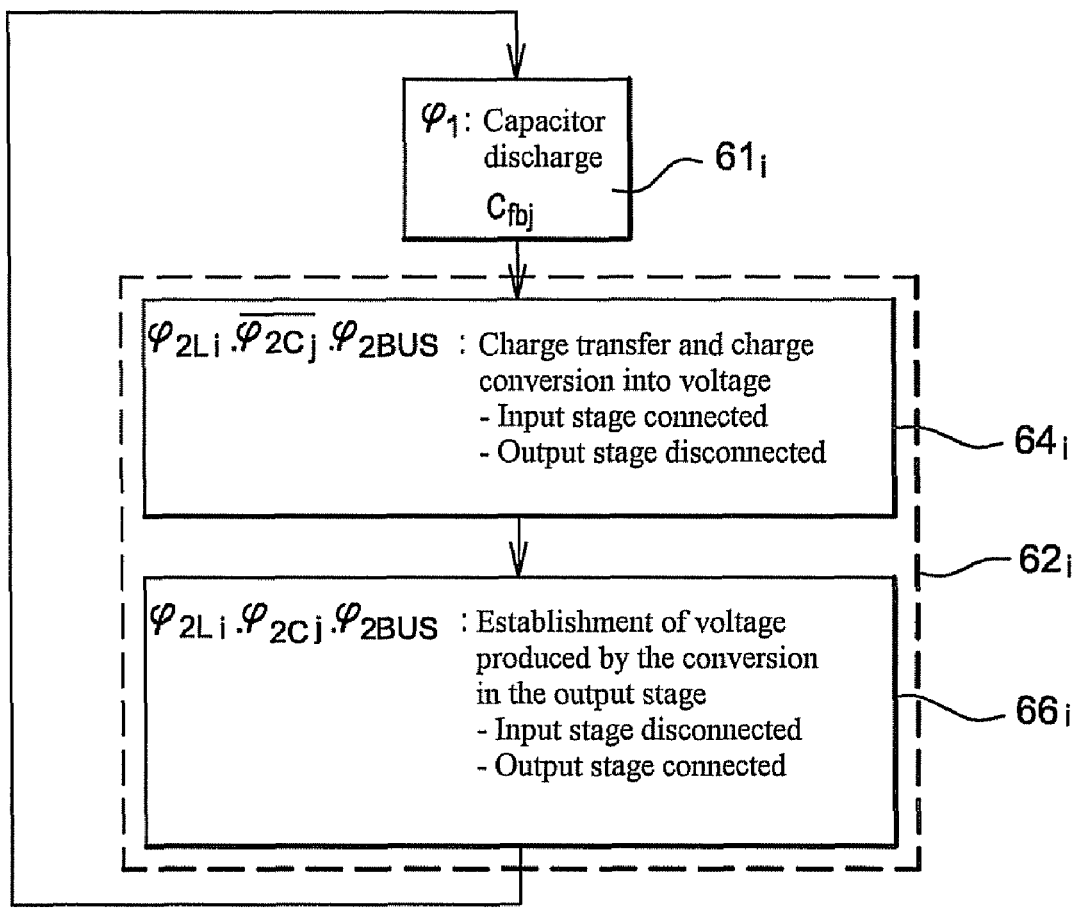
FIG. 19 is a flowchart of a method for controlling a charge conversion device forming part of the charge converter in FIG. 18.
Figure 31:
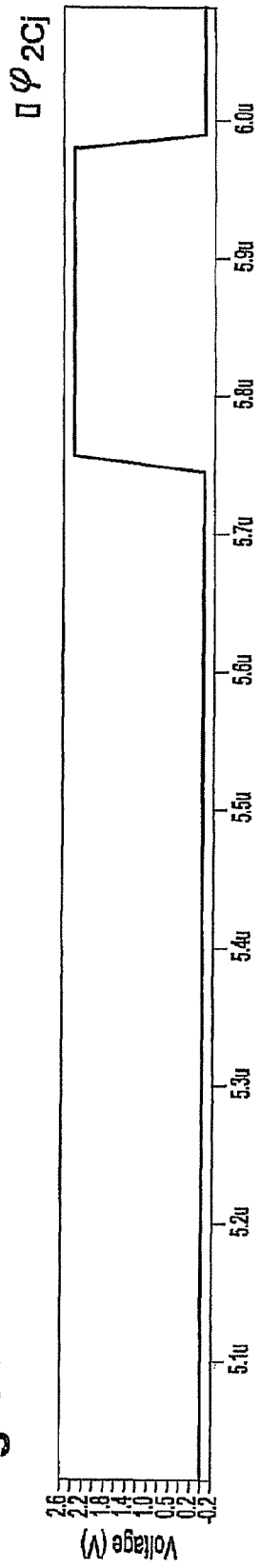
Figure 32:
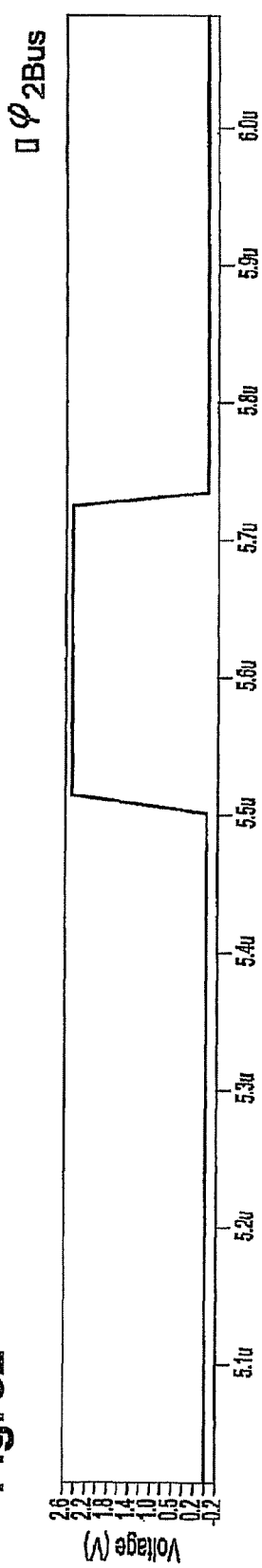
Figure 33:
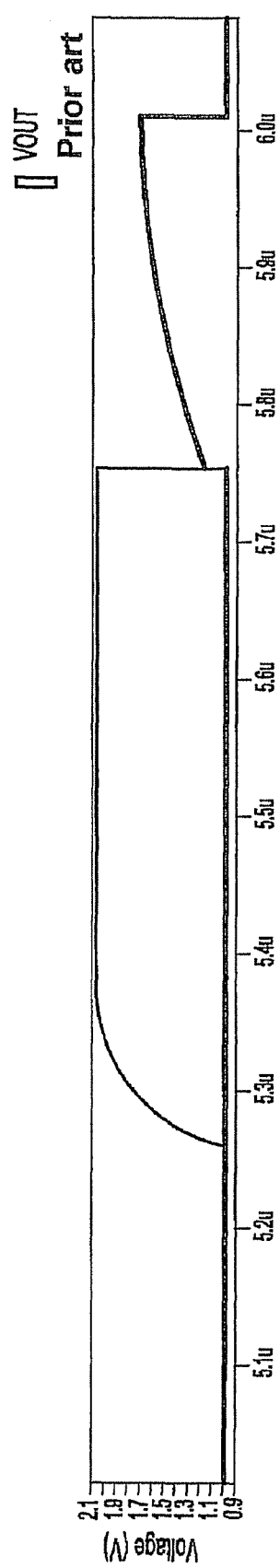
Figure 34:
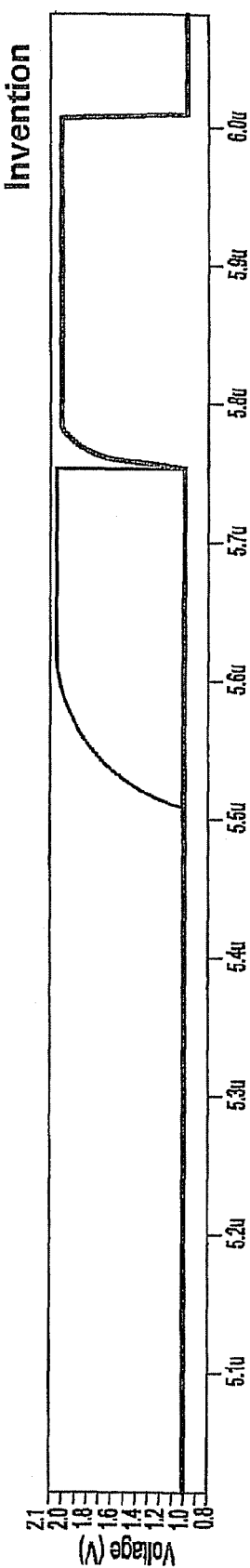

A charge converter 302 of the invention, as shown in FIG. 18, also comprises C charge conversion devices $60_1$-$60_C$. These charge conversion devices $60_1$-$60_C$ differ from those of the prior art in that it further comprises fourth controllable circuit breakers $62_1$-$62_C$ arranged between the non-inverting inputs $20_1$-$20_C$ of the amplifiers $16_1$-$16_C$ and the column buses $31_1$-$31_C$ respectively.

The fourth circuit breakers $62_1$-$62_C$ are controlled by a generator $80_m$ of control signals which differs from the prior art generator $70_m$ in that it further produces a control signal $\phi_{2BUS}$ of the fourth circuit breakers $62_1$-$62_C$.

The operation of the charge converter 302 of the invention is shown in FIGS. 19 to 28.

This operation differs from that in the prior art shown in FIGS. 9 to 17, in that the input of the charge conversion devices $60_1$-$60_C$ is disconnected from the column buses $31_1$-$31_C$ prior to the transfers of voltages resulting from the charge conversions stored at the terminals of the capacitors $18_1$-$18_C$ to the column multiplexer $14_m$. This therefore makes it possible, during sequential establishment of the voltages $V_{out}$ in the output stage $14_m$, to isolate the charge conversion devices $60_1$-$60_C$ from their main input parasitic capacitors $C_{bus1}$-$C_{busC}$. Thus, as can be seen in FIG. 28, the circuit breakers $62_1$-$62_C$ are continually on, except for a time interval needed to transfer the charges from the pixels into the capacitors $18_1$-$18_C$.

A very significant reduction in the charge conversion device establishment time, together with a correct establishment of the voltage $V_{out}$ when reading out the matrix 100, are thus obtained, as is shown in FIGS. 29 to 34. FIGS. 29 to 34 show, for the readout of a line i of the matrix 100, the charge conversion of the pixel of column j. As can be observed in FIG. 39, the permanent connection of a prior art charge conversion device to a column bus does not allow the charge in its entirety to be converted because the establishment time is too high. On the other hand, according to the invention, the effect of isolating the conversion device from the column bus when establishing the voltage $V_{out}$ in the output stage is a significant drop in the establishment time and a complete conversion of the charge.

For the same reasons as those mentioned previously in relation to the device in FIG. 2, the circuit breakers $62_1$-$62_C$ and the circuit breakers $52_1$-$52_C$ are placed as close as possible to the amplifiers constituted by the operational amplifiers $16_1$-$16_C$ with inverse feedback via the capacitors $18_1$-$18_C$.

An embodiment of the invention has been described wherein N charge conversion devices ($10_i$, $10_j$, $10_N$,) convert the charges of a matrix of pixels arranged in L lines by C columns with the special feature N=C by dint of having one charge conversion device per column.

Clearly the invention also applies to instances where it is necessary to pool the charge conversion devices in respect of a plurality of columns, wherein there is the relationship N=C/M with M representing for example the number of columns associated with one charge conversion device.

The invention also applies in instances where a plurality of charge conversion devices are associated in respect of a single column, wherein there is the relationship N=C.P with P representing for example the number of charge conversion devices per column.

Arrangements and operating modes have been described for non-differential charge conversion devices.

Figure 35:
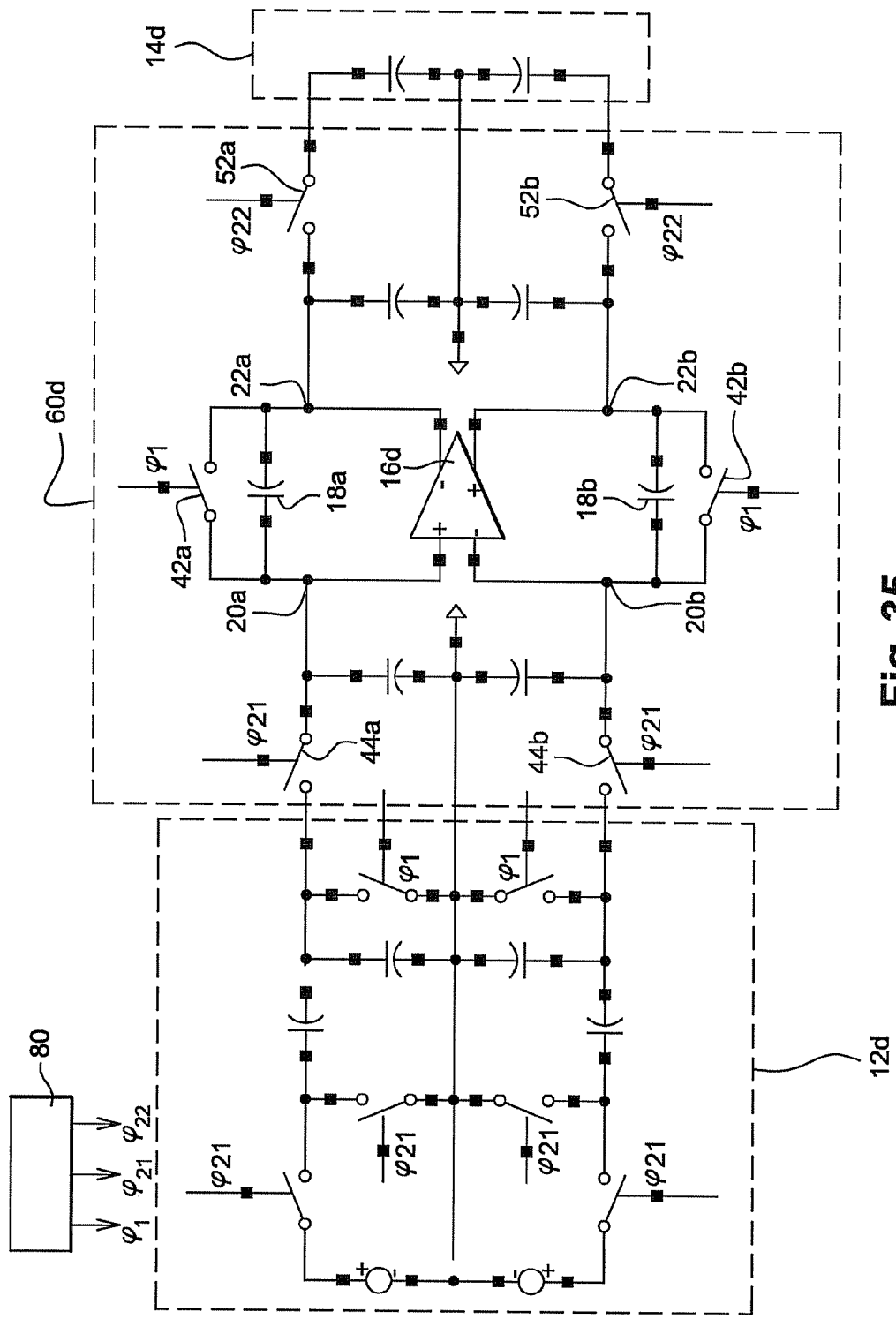
FIG. 35 is a diagrammatic view of a differential device for switched-capacitor charge conversion according to the invention.

Clearly, the invention also applies to differential charge conversion by a differential amplifier whereof each output is mounted in inverse feedback on an input by means of a capacitor. A differential charge conversion device 60d is shown in FIG. 35. This device 60d repeats the inverse feedback and circuit breaker structure described in relation to FIG. 2 for each of the inverting and non-inverting inputs of an amplifier 16d.

The two branches of the amplifier are then controlled synchronously according to a phase comprising the amplification and storage of the charges in the inverse feedback capacitors and a phase comprising the transfer of the stored charges to the output stage described in relation to FIGS. 2 to 4.

By means of the invention, the following advantages are thus obtained:

an appreciable gain in charge conversion speed by means of a reduction in the equivalent capacitances;

increased independence of the charge conversion characteristics in respect of the input and output stages;

a minor modification of the structure of prior art charge conversion devices;

a possibility of increasing the charge conversion frequency, by reducing for example the readout time of a matrix of pixels;

a possibility of increasing the charge-to-voltage conversion gain while retaining the same conversion time; and a possibility of reducing the consumption and/or the surface of the amplifiers by reducing the transconductance $g_m$.

The invention claimed is:

1. A method for controlling a device for converting charge into voltage comprising an amplifier and at least one capacitor mounted in inverse feedback between an input and an output of said amplifier, whereby said amplifier can be connected between at least one input stage, to receive at least one charge therefrom, and at least one output stage to deliver voltage thereto, said voltage being representative of the charge received, said method comprising at least one phase of conversion of the charge received at the input, wherein the conversion phase comprises at least:
one first sub-phase during which the amplifier is connected to the input stage and the amplifier is disconnected from the output stage;
followed by a second sub-phase during which the amplifier is disconnected from the input stage and the amplifier is connected to the output stage,
and wherein the input stage is of the MEMS or NEMS type and comprises a time-variable capacitor, the input stage producing a charge as a function of said variable capacitor.

2. The control method as claimed in claim 1, wherein the durations of the two sub-phases are substantially identical.

3. The control method as claimed in claim 1, wherein the durations of the two sub-phases are regulated as a function of the time constants of the units formed, on the one hand, by the conversion device connected to the input stage, and on the other hand, by the conversion device connected to the output stage.

4. The control method as claimed in claim 1, wherein the or each amplifier is an operational amplifier, whereof the inverting input and the output are mounted in inverse feedback via a capacitor.

5. The control method as claimed in claim 1, wherein the or each amplifier is a differential amplifier whereof each input is mounted in inverse feedback with an output of the amplifier by means of a capacitor.

6. The control method as claimed in claim 1, wherein the location of the connection and disconnection of the amplifier at the input stage and/or the location of the connection and disconnection of the amplifier at the output stage is placed as close as possible to the amplifier.

7. A system for converting charge comprising:
a device for converting charge into voltage comprising an amplifier and at least one capacitor mounted in inverse feedback between an input and an output of said amplifier, whereby said amplifier can be connected between at least one input stage, to receive at least one charge therefrom, and at least one output stage to deliver voltage thereto, said voltage being representative of the charge received;
a first controllable element capable of disconnecting the amplifier from the input stage; and
a control device capable of controlling the first controllable element according to a first phase of conversion of a charge received from the input stage by the amplifier,
wherein it further comprises a second controllable element capable of disconnecting the amplifier from the output stage, the control device being capable, during the conversion phase, at least of:
controlling the first element in order to connect the amplifier to the input stage, and controlling the second element in order to disconnect the amplifier from the output stage;
and then, controlling the first element in order to disconnect the amplifier from the input stage and controlling the second element in order to connect the amplifier to the output stage;
and wherein the input stage is of the MEMS or NEMS type and comprises a time-variable capacitor, the input stage producing a charge as a function of said variable capacitor.

8. The system for converting charge as claimed in claim 7, wherein the first controllable element and/or the second controllable element is placed as close as possible to the amplifier.

\* \* \* \* \*